United States Patent
Lin et al.

(10) Patent No.: US 9,337,195 B2
(45) Date of Patent: May 10, 2016

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Yu Chao Lin, Hsin-Chu (TW); Ming-Ching Chang, Hsin-Chu (TW); I-Yin Lu, Kaohsiung (TW); Jih-Jse Lin, Sijhih (TW); Chao-Cheng Chen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 59 days.

(21) Appl. No.: 14/133,375

(22) Filed: Dec. 18, 2013

(65) Prior Publication Data

US 2015/0171084 A1 Jun. 18, 2015

(51) Int. Cl.
| | | |
|---|---|---|
| *H01L 23/02* | (2006.01) | |
| *H01L 27/092* | (2006.01) | |
| *H01L 27/088* | (2006.01) | |
| *H01L 21/8234* | (2006.01) | |
| *H01L 21/8238* | (2006.01) | |
| *H01L 21/3213* | (2006.01) | |
| *H01L 21/311* | (2006.01) | |

(52) U.S. Cl.
CPC ...... *H01L 27/0922* (2013.01); *H01L 21/31144* (2013.01); *H01L 21/32135* (2013.01); *H01L 21/823431* (2013.01); *H01L 21/823437* (2013.01); *H01L 21/823821* (2013.01); *H01L 21/823828* (2013.01); *H01L 27/0886* (2013.01); *H01L 27/0924* (2013.01)

(58) Field of Classification Search
CPC ............... H01L 21/28273; H01L 21/823412; H01L 21/823431; H01L 27/115; H01L 27/11521; H01L 29/66; H01L 29/78; H01L 29/79; H01L 29/94; H01L 29/42324; H01L 29/66795; H01L 29/66545
USPC .......... 438/637, 421–424, 257; 257/E21.423, 257/214, 209
See application file for complete search history.

(56) References Cited

U.S. PATENT DOCUMENTS

| | | | | |
|---|---|---|---|---|
| 7,595,522 | B2* | 9/2009 | Takeuchi | 257/298 |
| 8,581,322 | B2* | 11/2013 | Lu et al. | 257/315 |
| 9,214,383 | B2* | 12/2015 | Liu | H01L 23/53233 |
| 2004/0217420 | A1* | 11/2004 | Yeo et al. | 257/347 |
| 2007/0170474 | A1* | 7/2007 | Kawasaki | 257/288 |
| 2007/0202691 | A1* | 8/2007 | Lee et al. | 438/637 |
| 2007/0278576 | A1* | 12/2007 | Kim et al. | 257/347 |
| 2008/0116503 | A1* | 5/2008 | Tsurumi et al. | 257/316 |
| 2009/0137093 | A1* | 5/2009 | Lin | 438/421 |
| 2009/0242964 | A1* | 10/2009 | Akil et al. | 257/324 |
| 2010/0072550 | A1* | 3/2010 | Matsuo | 257/347 |
| 2010/0084703 | A1* | 4/2010 | Tsurumi et al. | 257/326 |
| 2011/0121382 | A1* | 5/2011 | Chakihara et al. | 257/326 |
| 2011/0169068 | A1* | 7/2011 | Lee et al. | 257/321 |
| 2014/0159171 | A1* | 6/2014 | Cai et al. | 257/412 |
| 2014/0239393 | A1* | 8/2014 | Kuo et al. | 257/347 |
| 2014/0256094 | A1* | 9/2014 | Lin et al. | 438/158 |
| 2015/0008501 | A1* | 1/2015 | Sakuma et al. | 257/316 |

* cited by examiner

*Primary Examiner* — Michael Lebentritt
(74) *Attorney, Agent, or Firm* — Slater & Matsil, L.L.P.

(57) ABSTRACT

Semiconductor devices and methods of manufacture thereof are disclosed. In some embodiments, a method of manufacturing a semiconductor device includes providing a workpiece including a gate dielectric and a gate disposed over the gate dielectric, and reshaping a top surface of the gate to form a gate with a rounded profile.

20 Claims, 10 Drawing Sheets

SEMICONDUCTOR DEVICES AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is used often in semiconductor devices. There may be millions of transistors on a single integrated circuit (IC), for example. A common type of transistor used in semiconductor device fabrication is a metal oxide semiconductor field effect transistor (MOSFET), as an example. A planar transistor typically includes a gate dielectric disposed over a channel region in a substrate, and a gate electrode formed over the gate dielectric. A source region and a drain region of the transistor are formed on either side of the channel region.

Multiple gate field-effect transistors (MuGFETs) are a recent development in semiconductor technology. One type of MuGFET is referred to as a FinFET, which is a transistor structure that includes a fin-shaped semiconductor material that is raised vertically out of the semiconductor surface of an integrated circuit.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to methods of manufacturing transistors of semiconductor devices and structures thereof. Novel transistors with recessed gates and manufacturing processes thereof will be described herein.

Figure 1:
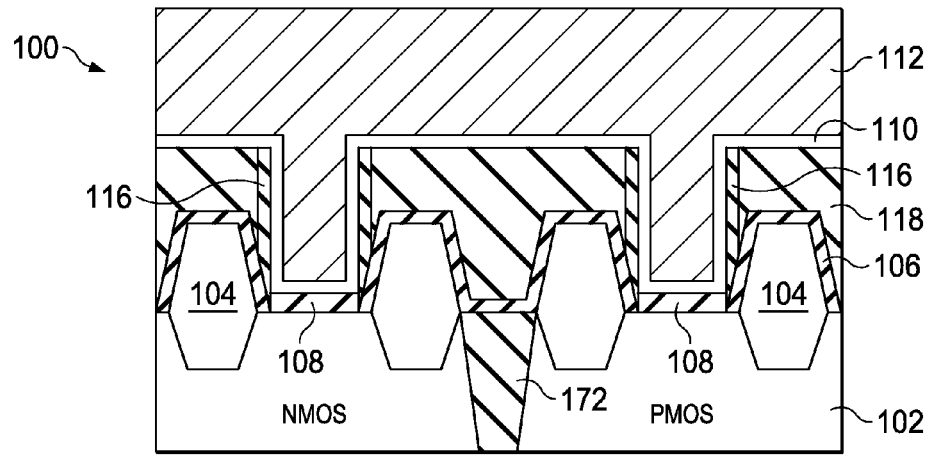
FIGS. 1 through 16 are cross-sectional views that illustrate methods of manufacturing a semiconductor device at various stages in accordance with some embodiments.

FIGS. 1 through 16 are cross-sectional views of a semiconductor device 100 at various stages of manufacturing that illustrate methods of manufacturing the semiconductor device 100 in accordance with some embodiments. Referring first to FIG. 1, there is shown a cross-sectional view of a semiconductor device 100 that includes a FinFET in an early manufacturing stage in accordance with some embodiments. The semiconductor device 100 includes a workpiece 102. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

In some embodiments, the workpiece 102 includes an n channel metal oxide semiconductor (NMOS) region where an NMOS transistor device will be formed. The workpiece 102 also includes a p channel metal oxide semiconductor (PMOS) region where a PMOS transistor device will be formed. The workpiece 102 may include implantation regions suitable for the NMOS region and PMOS region, not labeled. The workpiece 102 may include shallow trench isolation (STI) regions 172 or other types or insulating regions disposed between the NMOS region and PMOS region and in other regions of the workpiece 102. Only one NMOS region and PMOS region is shown in the drawings; however, a plurality of NMOS regions and PMOS regions may be formed across a surface of the workpiece 102 in accordance with some embodiments.

A plurality of fins 104 are formed over the workpiece 102. The fins 104 may be formed within and over the workpiece 102 in some embodiments. The fins 104 comprise a semiconductive material in some embodiments. The fins 104 may comprise silicon, SiGe, Ge, graphite, graphene, and/or silicon dopant materials in some embodiments, as examples. The fins 104 may be implanted with dopants, such as B, As, and/or P in some embodiments. Alternatively, the fins 104 may comprise other materials, may be implanted with other dopants, or may not be implanted with dopants.

Figure 18:
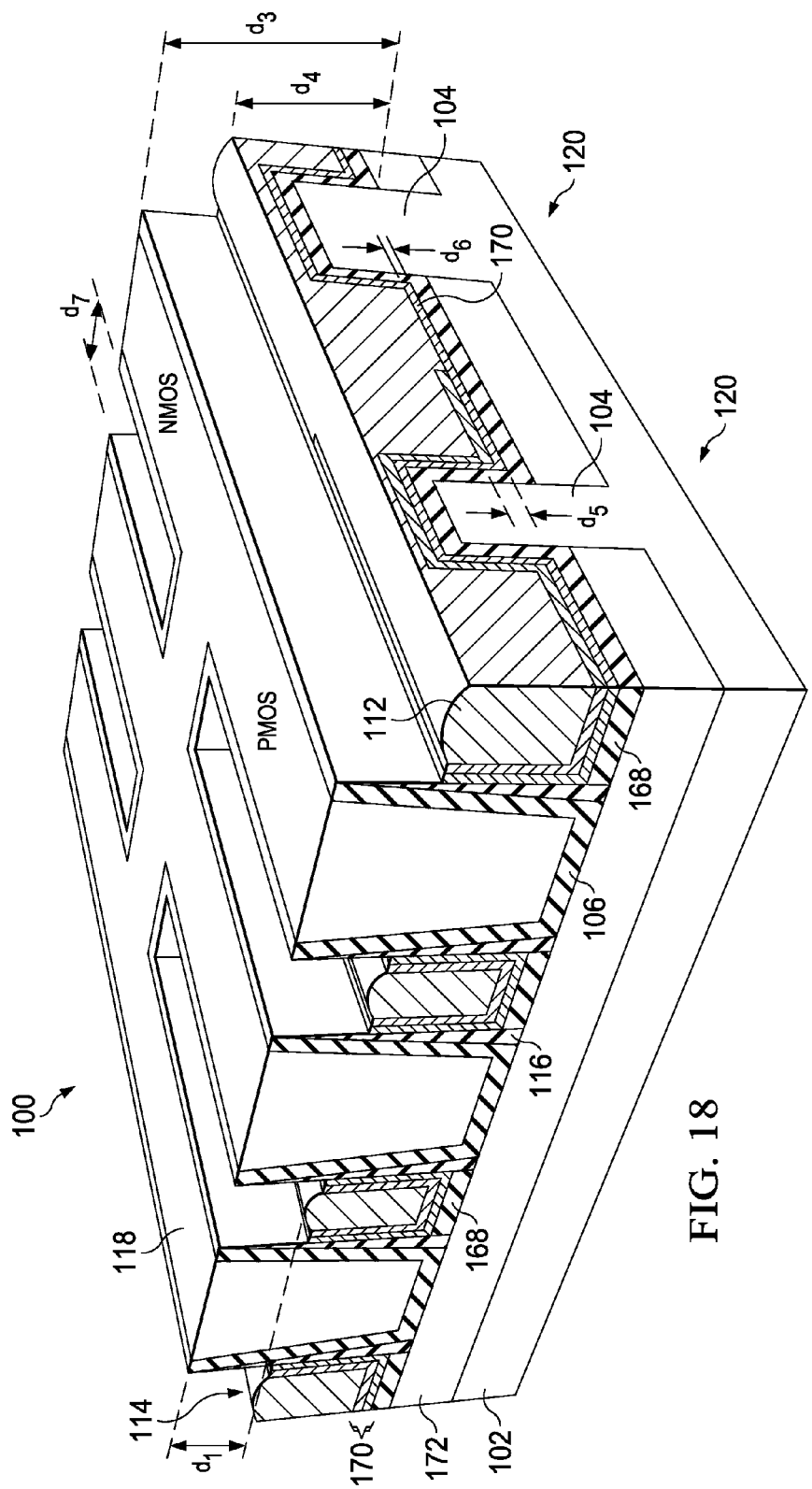
FIG. 18 is a perspective view of a semiconductor device in accordance with some embodiments.

The fins 104 may have angled or tapered sidewalls, as shown in FIG. 1, or the fins 104 may have substantially straight sidewalls, as shown in FIG. 18. The fins 104 may alternatively comprise other shapes. The fins 104 extend in and out of the paper in the view shown by a predetermined distance, such as a few μm to a few mm, as examples. The fins 104 may be formed from a portion of the workpiece 102, e.g., in embodiments wherein the workpiece 102 comprises an SOI substrate. Alternatively, the fins 104 may be formed by epitaxial growth, deposition and lithography processes, or other methods. Combinations of these and other methods may also be used to form the fins 104. The fins 104 may comprise sources, drains, and/or channels of a transistor comprising a FinFET in some embodiments. Alternatively, the fins 104 may be adapted to perform other functions. The fins 104 comprise a height about a top surface of the workpiece 102 of about 20 nm to about 50 nm in some embodiments. The fins 104 may comprise a height of about 30 nm in some embodiments, for example. Alternatively, the fins 104 may comprise other dimensions.

A contact etch stop layer (CESL) 106 is formed over the fins 104 and over portions of the workpiece 102 in some embodiments. The CESL 106 comprises a layer of SiN, SiON, SiC, and/or an oxide having a thickness of about 50 Angstroms to about 100 Angstroms in some embodiments. The CESL 106 may be formed using a deposition process such as chemical vapor deposition (CVD), physical vapor deposition (PVD), or atomic layer deposition (ALD) at a temperature of about 400 degrees C. to about 600 degrees C., as examples. Alternatively, the CESL 106 may comprise other materials and dimensions, and may be formed using other methods and temperatures. In some embodiments, a CESL 106 is not included.

An insulating material 108 is formed over the workpiece 102 between adjacent fins 104 in the NMOS region and PMOS region. If the CESL 106 is formed using a blanket deposition process, the CESL 106 may be removed between the fins 104 using a lithography and etch process before forming the insulating material 108, for example. The insulating material 108 may comprise an oxide in some embodiments that is formed using an oxidation process of the workpiece 102, for example. Alternatively, the insulating material 108 may be formed using a deposition, lithography, and etch process. In some embodiments, the insulating material 108 comprises about 5 Angstroms to about 20 Angstroms of $SiO_2$, plasma-enhanced CVD (PECVD) oxide, a thermal oxide, or an anneal native oxide in some embodiments, as examples. Alternatively, the insulating material 108 may comprise other materials and dimensions, and may be formed using other methods.

An insulating material 118 is formed over the workpiece 102 over the CESL 106 and over the insulating material 108. The insulating material 118 comprises a first inter-level dielectric (ILD) in some embodiments, for example. The insulating material 118 is also referred to herein, e.g., in some of the claims, as a first insulating material. In some embodiments, the insulating material 118 comprises about 400 Angstroms to about 1,000 Angstroms of $SiO_2$, a thermal oxide, or PECVD oxide, as examples. The insulating material 118 may be formed using CVD, flowable CVD (FCVD), PVD, and/or a high density plasma (HDP) deposition process, as examples. Alternatively, the insulating material 118 may comprise other materials and dimensions, and may be formed using other methods.

The insulating material 118 is removed from between two of the plurality of fins 104 in accordance with embodiments. For example, the insulating material 118 may be removed using a lithography and etch process, or other methods. A portion of the workpiece 102 is exposed between the fins 104; e.g., the insulating material 108 over the workpiece 102 is exposed after the removal of the insulating material 118. The insulating material 118 is disposed over the fins 104 yet not disposed between the two fins 104, e.g., in the NMOS region and the PMOS region of the workpiece 102.

In some embodiments, a liner 116 is formed on sidewalls of the insulating material 118. The liner 116 protects subsequently deposited materials from migrating into and damaging the insulating material 118 and other material layers of the semiconductor device 100 in some embodiments. The liner 116 comprises about 20 Angstroms to about 80 Angstroms of SiN, SiON, or a silicon-dopant photoresist, as examples. The liner 116 may be formed using CVD, PVD, or ALD at a temperature of about 400 degrees C. to about 600 degrees C., as examples. In some embodiments, the liner 116 is formed by depositing a blanket layer of the liner 116 material over the patterned insulating material 118 and insulating material 108 over the workpiece 102, and etching the liner 116 material using an anisotropic etch process, which removes the liner 116 from top surfaces yet leaves the liner 116 on sidewall surfaces such as the patterned insulating material 118. Alternatively, the liner 116 may comprise other materials and dimensions, and may be formed using other methods and temperatures. The liner 116 functions as a seal layer for the insulating material 118 sidewalls in some embodiments, for example.

Next, a dielectric material and first conductive material layer 110 are formed over the top surfaces of the insulating material 118, over the insulating material 108, and over the liner 116 on the sidewalls of the insulating material 118. The dielectric material and first conductive material layer 110 comprise two or more layers and are shown and described in more detail in FIG. 17. The dielectric material 168 of the dielectric material and first conductive material layer 110 comprises one or more insulating material layers and functions as a gate dielectric in some embodiments. The dielectric material 168 is disposed over the sidewalls (e.g., over the liner 116), over the top surface of the insulating material 118, and over a portion of the workpiece 102 (e.g., over the insulating material 108 disposed over the workpiece 102). The first conductive material 170 of the dielectric material and first conductive material layer 110 comprises a work function metal in some embodiments that includes a plurality of conductive layers. The dielectric material 168 and first conductive material 170 of the dielectric material and first conductive material layer 110 will be described further herein. To simplify the drawings, the dielectric material 168 and first conductive material 170 are shown as a single material layer (e.g., the dielectric material and first conductive material layer 110) in FIGS. 1 through 16.

Referring again to FIG. 1, a second conductive material 112 is formed over the dielectric material and first conductive material layer 110. The second conductive material 112 comprises W or Cu, as examples, and may be deposited using PVD or electro-chemical plating (ECP), for example. The second conductive material 112 may comprise W deposited by PVD or Cu deposited using an ECP process in some embodiments, as examples. Alternatively, the second conductive material 112 may comprise other materials, and may be formed using other methods. The second conductive material 112 fills the patterns in the insulating material 118 over the dielectric material and first conductive material layer 110. In some embodiments, the second conductive material 112 overfills the patterns or spaces in the insulating material 118 between pairs of the fins 104 and extends over the top surface of the insulating material 118, e.g., over the dielectric material and first conductive material layer 110, as shown in FIG. 1.

Figure 2:
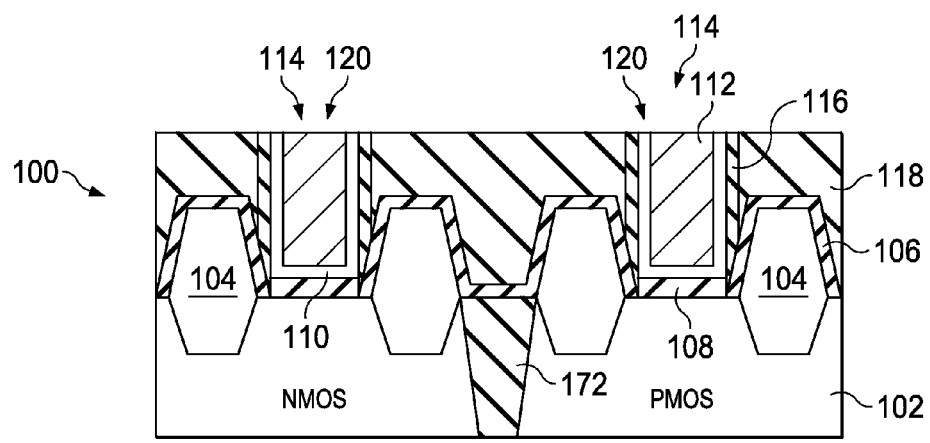

A chemical-mechanical polish (CMP) process and/or an etch process is used to remove excess portions of the second conductive material 112 from over the top surface of the insulating material 118, as shown in FIG. 2, leaving the dielectric material and first conductive material layer 110 and the second conductive material 112 remaining within the patterned insulating material 118. The second conductive material 112 and the first conductive material 170 (see FIG. 17) of the dielectric material and first conductive material layer 110 comprise a gate 114 of transistors 120 formed in the NMOS region and PMOS region of the workpiece 102. The first conductive material 170 and the second conductive material 112 comprise a gate material of the gate 114 disposed over the dielectric material 168. The gate material is adapted to function as a gate 114 of each of the transistors 120. The dielectric material 168 comprises a gate dielectric of the transistors 120.

Figure 3:
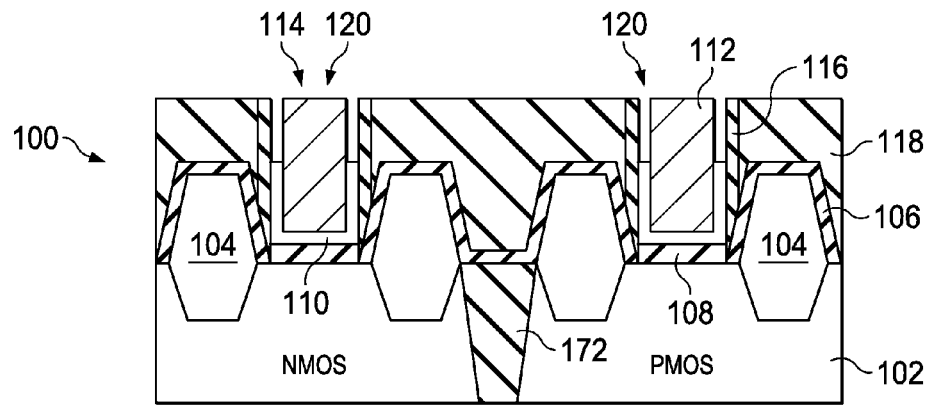
Figure 4:
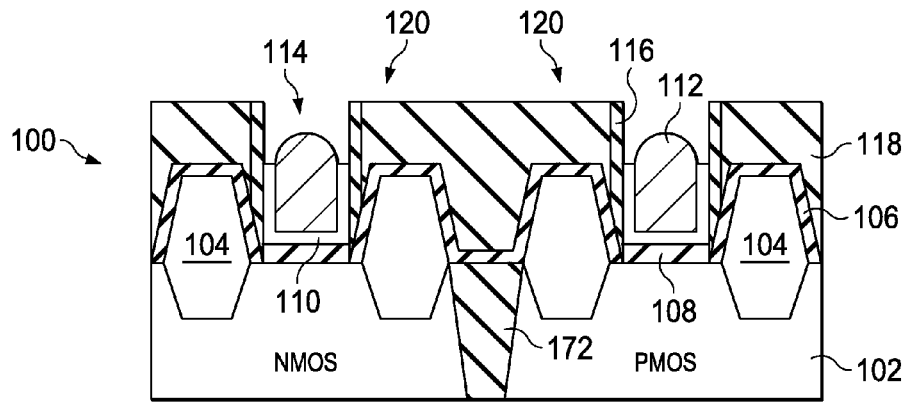

In accordance with some embodiments of the present disclosure, the dielectric material and first conductive material layer 110 and the second conductive material 112 are recessed within the patterns in the insulating material 118 so that their top surfaces reside below the top surface of the insulating material 118, as shown in FIGS. 3 and 4. The etch processes for the dielectric material and first conductive material layer 110 and the second conductive material 112 may be performed using an etch tool supplied by Lam Research Corporation; Tokyo Electron Limited (TEL); Applied Materials, Inc.; Hitachi Ltd.; or a combination thereof, as examples. Alternatively, etch tools supplied by other companies may be used.

In FIG. 3, the dielectric material and first conductive material layer 110 is recessed using an etch process. The etch process for the dielectric material and first conductive material layer 110 comprises an etch process chemistry of $SF_6$, $O_2$, $NF_3$, $CF_4$, and/or combinations thereof in some embodiments, for example. Alternatively, other etch chemistries may be used. In some embodiments, only the first conductive material 170 of the dielectric material and first conductive material layer 110 is recessed. In other embodiments, both the dielectric material 168 and the first conductive material 170 of the dielectric material and first conductive material layer 110 are recessed.

The second conductive material 112 is then recessed, as shown in FIG. 4. The recessing process comprises reshaping a top surface of the gate material, e.g., the upper second conductive material 112, to form a gate 114 with a rounded profile. The top surface of the second conductive material 112 is reshaped using an etch process. Recessing the second conductive material 112 comprises an etch process comprising an etch chemistry of $Cl_2$, $BCl_3$, and/or combinations thereof in some embodiments, for example. Recessing the second conductive material 112 comprises an etch process comprising a flow rate of about 10 standard cubic centimeters per minute (s.c.c.m.) to about 200 s.c.c.m. and a pressure of about 1 mT to about 30 mT, in some embodiments. Recessing the second conductive material comprises an etch process comprising a chuck temperature of about 30 degrees C. to about 60 degrees C. and/or chamber wall temperature of about 50 degrees C. to about 90 degrees C., in some embodiments. For example, the semiconductor device 100 in wafer form may be placed on a support or chuck, such as an electronic static chuck (ESC), in a processing chamber, and the temperature of the chuck and/or a wall of the chamber may be monitored and controlled to a desired temperature, in some embodiments. Alternatively, the etch process used to recess and reshape the top surface of the second conductive material 112 may comprise other etch chemistries, flow rates, pressures, temperatures, and other processing parameters.

After the etch process for the second conductive material 112, the edge regions of the top surface of the second conductive material 112 have a decreased height or thickness than a height or thickness of central regions of the second conductive material 112, as shown in FIG. 4. The central regions of the second conductive material 112 have a greater height than a height of the first conductive material of the dielectric material and first conductive material layer 110, in some embodiments. The properties of the etch process used to recess the second conductive material 112 are selected to achieve a dome shape on the top surface of the second conductive material 112 in a cross-sectional view of the semiconductor device 100, for example. In some embodiments, an isotropic etch process is used wherein the etchant chemistry etches the second conductive material 112 more aggressively near the liner 116 and sidewalls of the insulating material 118 than at the central region of the second conductive material 112, as an example. In some embodiments, the etch selectivity is controlled between the second conductive material 112, the liner 116, and the first conductive material 170 of the dielectric material and first conductive material layer 110. For example, an etch recipe can be controlled to etch the first conductive material 170 of the dielectric material and first conductive material layer 110 faster than the second conductive material 112, without etching the liner 116. In some embodiments, the first conductive material 170 of the dielectric material and first conductive material layer 110 is re-sputtered around the second conductive layer 112 on the left and right sides in the view shown in FIG. 4, for example. The curved top surface of the second conductive material 112 advantageously provides a larger surface area and contact area for a subsequently formed contact to make electrical and mechanical connection with the gate 114, to be described further herein.

Figure 5:
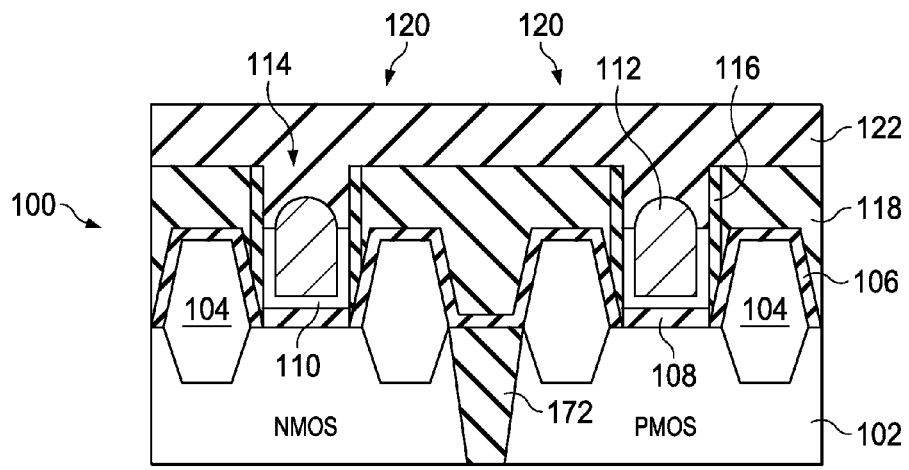
Figure 6:
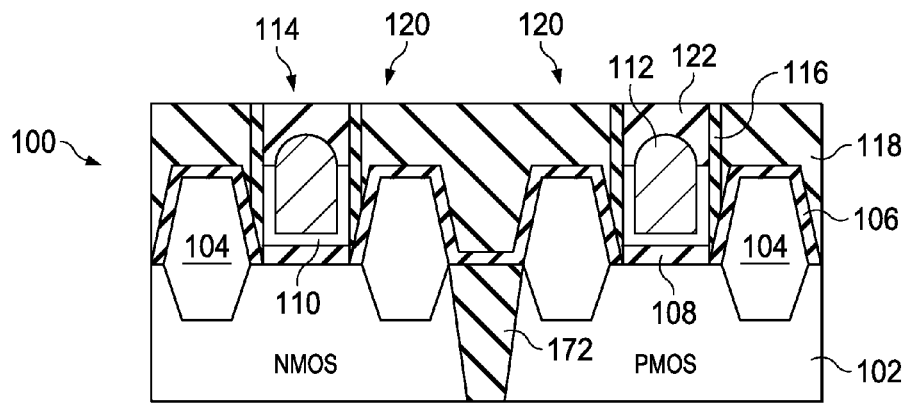

Next, an insulating material 122 is formed over the second conductive material 112, after recessing the first conductive material 170 (or the dielectric material and first conductive material layer 110) and the second conductive material 112, as shown in FIG. 5. The insulating material 122 is also referred to herein, e.g., in some of the claims, as a second insulating material 122. The insulating material 122 comprises SiN, an oxide, or SiON formed using CVD, PECVD, or FCVD, in some embodiments, as examples. Alternatively, the insulating material 122 may comprise other materials, and may be formed using other methods. A CMP process and/or etch process is then used to remove the insulating material 122 from over the top surface of the insulating material 118, as shown in FIG. 6.

Figure 7:
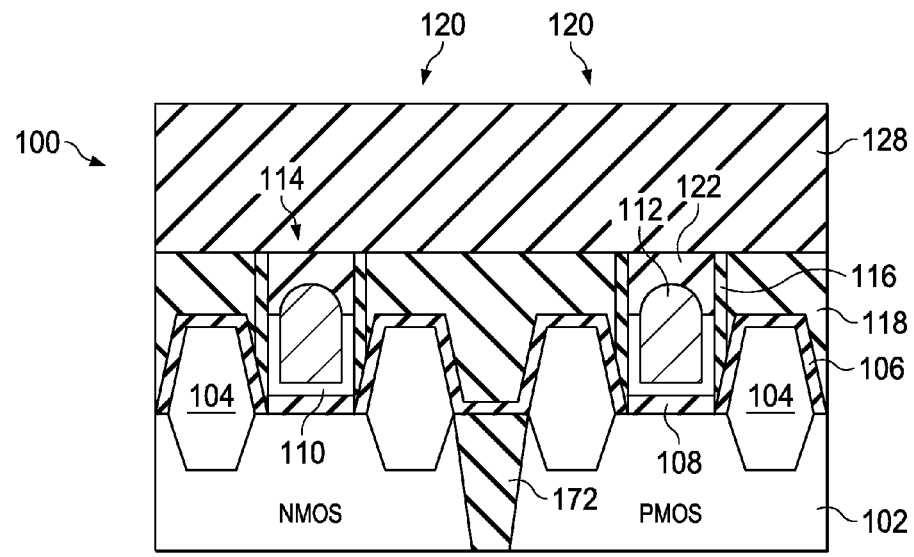

An insulating material 128 is then formed over the first insulating material 118 and over the second insulating material 122, and over the top surface of the liner 116, if it is included in the structure, as shown in FIG. 7. The insulating material 128 is also referred to herein, e.g., in some of the claims, as a third insulating material 128. The insulating material 128 comprises a second ILD in some embodiments and may comprise similar materials, dimensions, and deposition methods as described for the first insulating material 118, for example.

Figure 13:
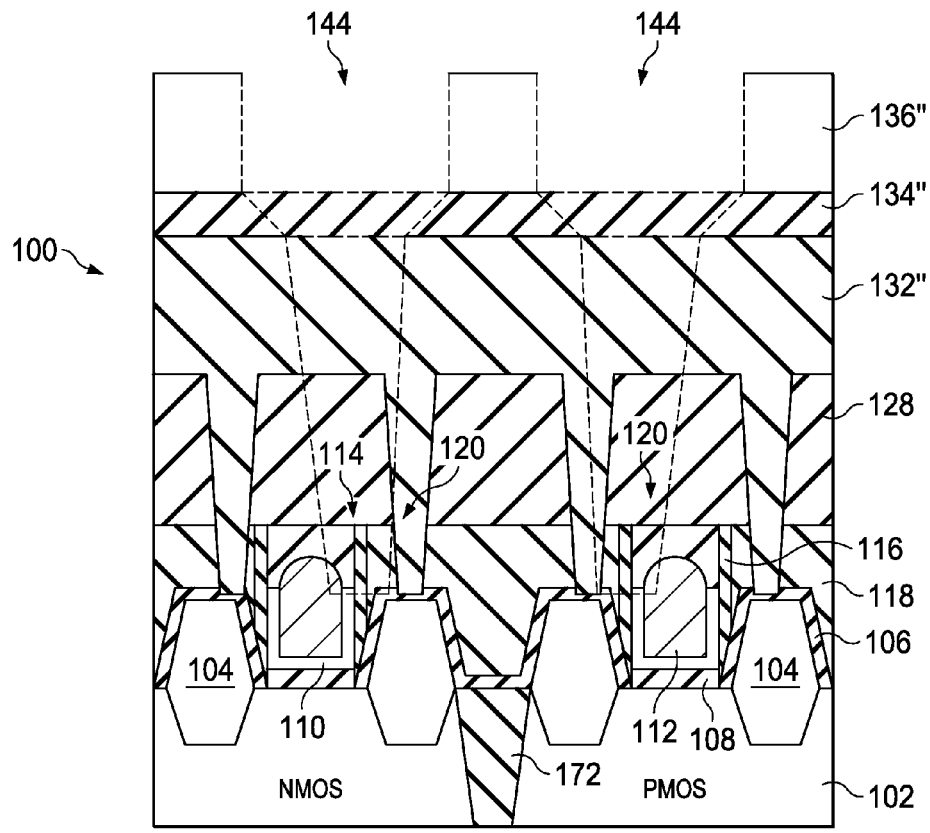
Figure 14:
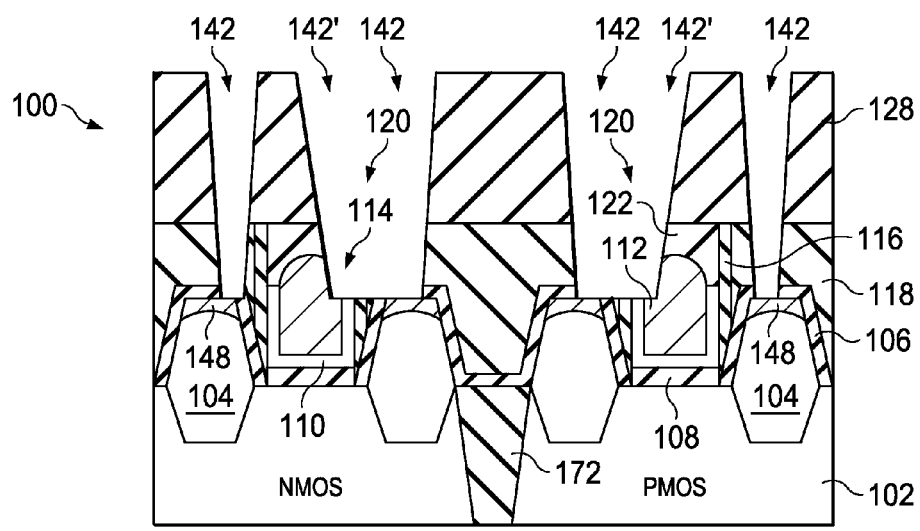
Figure 15:
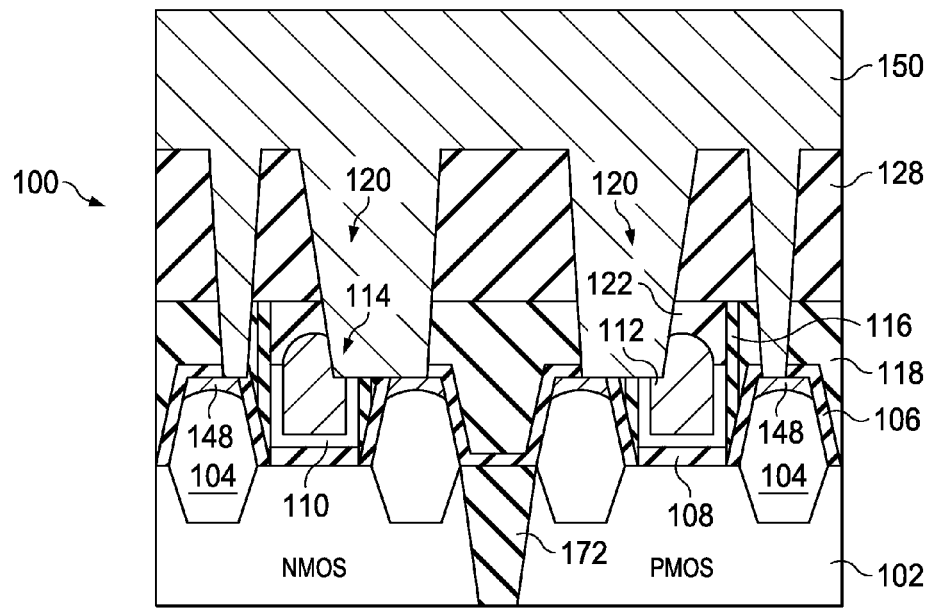
Figure 16:
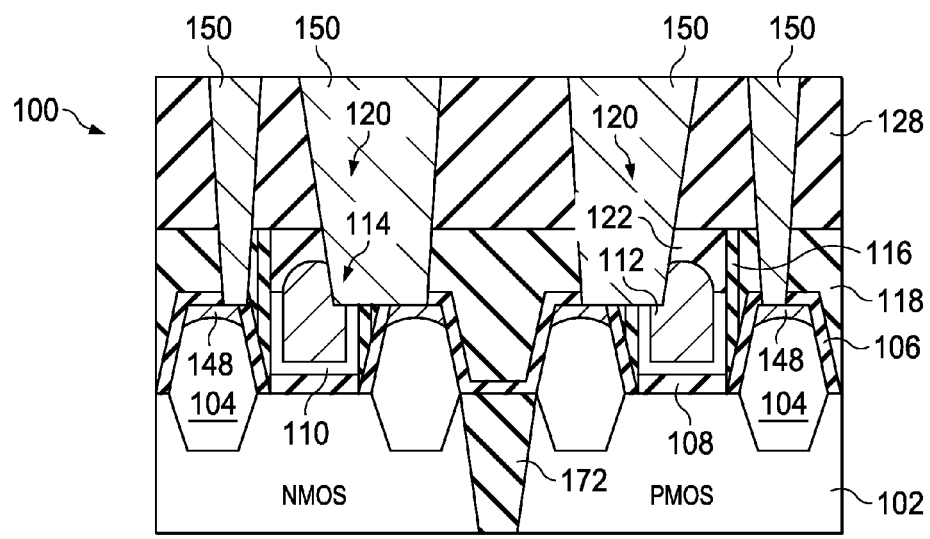

The third insulating material 128 and first insulating material 118, and portions of the second insulating material 122, liner 116, and CESL 106 are then patterned with a pattern for a plurality of contacts, as shown in FIGS. 8 through 14. Three lithography processes and two etch processes are used in some embodiments, and the patterns created in the various material layers are then filled simultaneously with a conductive material to form a plurality of contacts 150, as shown in FIGS. 15 and 16.

Figure 8:
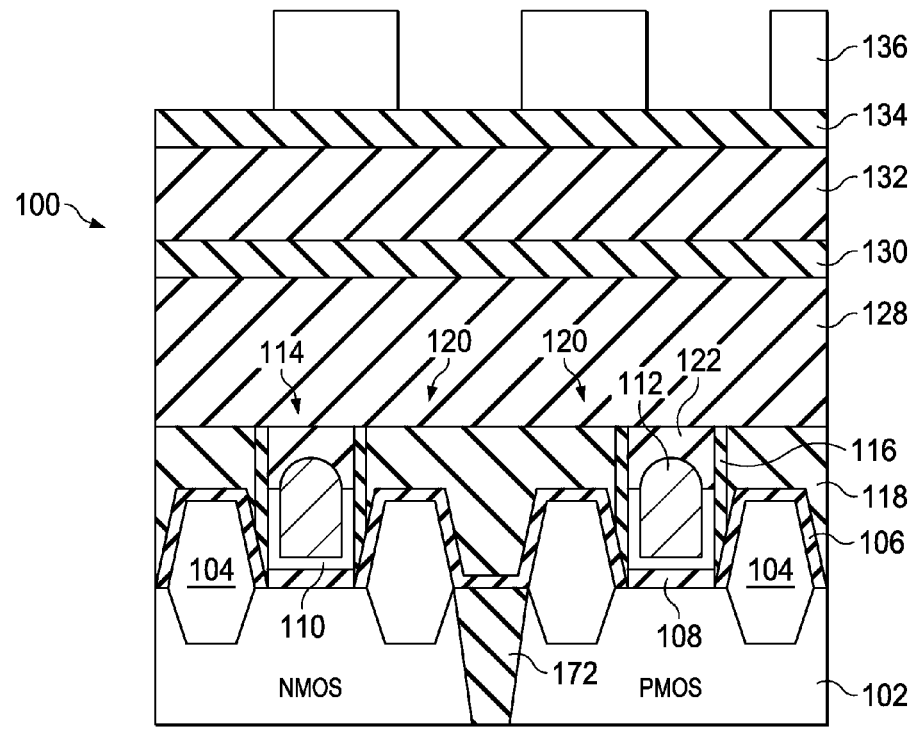

Referring next to FIG. 8, a hard mask 130 is formed over the third insulating material 128. The hard mask 130 comprises about 200 Angstroms to about 500 Angstroms of TiN, SiN, SiON, or SiC, as examples. The hard mask 130 may be formed using PVD or CVD, as examples. Alternatively, the hard mask 130 may comprise other materials and dimensions, and may be formed using other methods.

A bottom transfer layer 132 is formed over the hard mask 130, as shown in FIG. 8. The bottom transfer layer 132 comprises about 50 nm to about 2,000 nm of a material including C, H, and O in some embodiments, as examples. Alternatively, the bottom transfer layer 132 may comprise other dimensions and materials. The bottom transfer layer 132 comprises a sacrificial layer that is used to form patterns 138 (see FIG. 9) in the hard mask 130.

A middle transfer layer 134 is formed over the bottom transfer layer 132, also shown in FIG. 8. The middle transfer layer 134 comprises about 10 nm to about 50 nm of silicon oxide in some embodiments, as examples. Alternatively, the middle transfer layer 134 may comprise other dimensions and materials. The middle transfer layer 134 also comprises a sacrificial layer that is used to form patterns 138 in the hard mask 130.

A photoresist 136 is formed over the middle transfer layer 134, as shown in FIG. 8. The photoresist 136 is patterned using a first lithography process, by exposing the photoresist 136 to light or energy reflected from or transmitted through a first lithography mask having a desired pattern thereon. The photoresist 136 is then developed, and exposed portions (or unexposed portions, depending on whether the photoresist 136 comprises a positive or negative photoresist) of the photoresist 136 are etched away, leaving a pattern in the photoresist 136, as shown in FIG. 8. The pattern comprises a plurality of openings or patterns in the photoresist 136.

Figure 9:
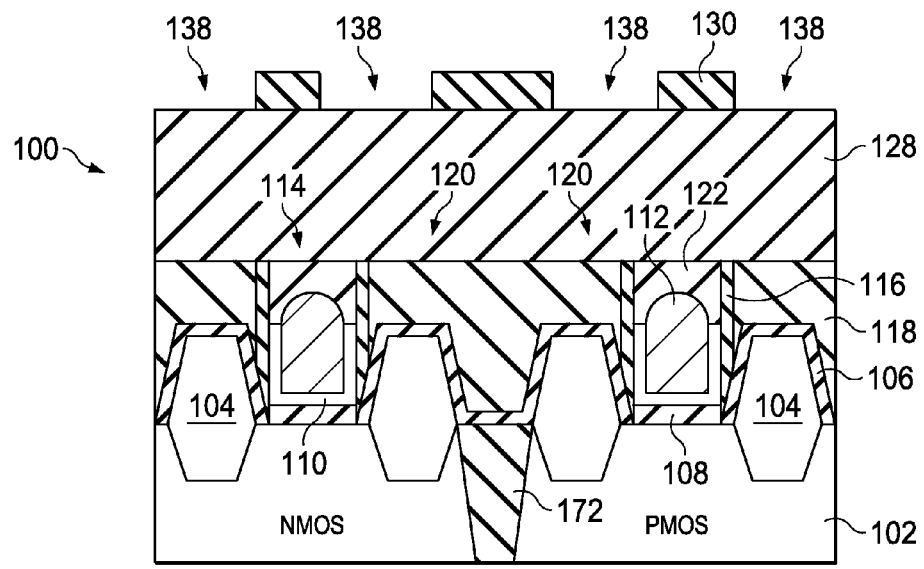

An etch process is performed on the semiconductor device 100 to transfer the patterns from the photoresist 136 to the middle transfer layer 134 and the bottom transfer layer 132. The middle transfer layer 134 and the bottom transfer layer 132, or the photoresist 136, middle transfer layer 134, and bottom transfer layer 132 are then used as an etch mask during an etch process for the hard mask 130, which transfers the patterns in the photoresist 136 to the hard mask 130, as shown in FIG. 9. The middle transfer layer 134, bottom transfer layer 132, and the photoresist 136 are then removed, also shown in FIG. 9. The photoresist 136 may be removed during the patterning of the middle transfer layer 134 and/or bottom transfer layer 132 in some embodiments, for example.

The photoresist 136 comprises a first photoresist 136, the middle transfer layer 134 comprises a first middle transfer layer 134, and the bottom transfer layer 132 comprises a first middle transfer layer 132 in some embodiments. The pattern 138 in the hard mask 130 comprises a first pattern 138 in some embodiments.

Figure 10:
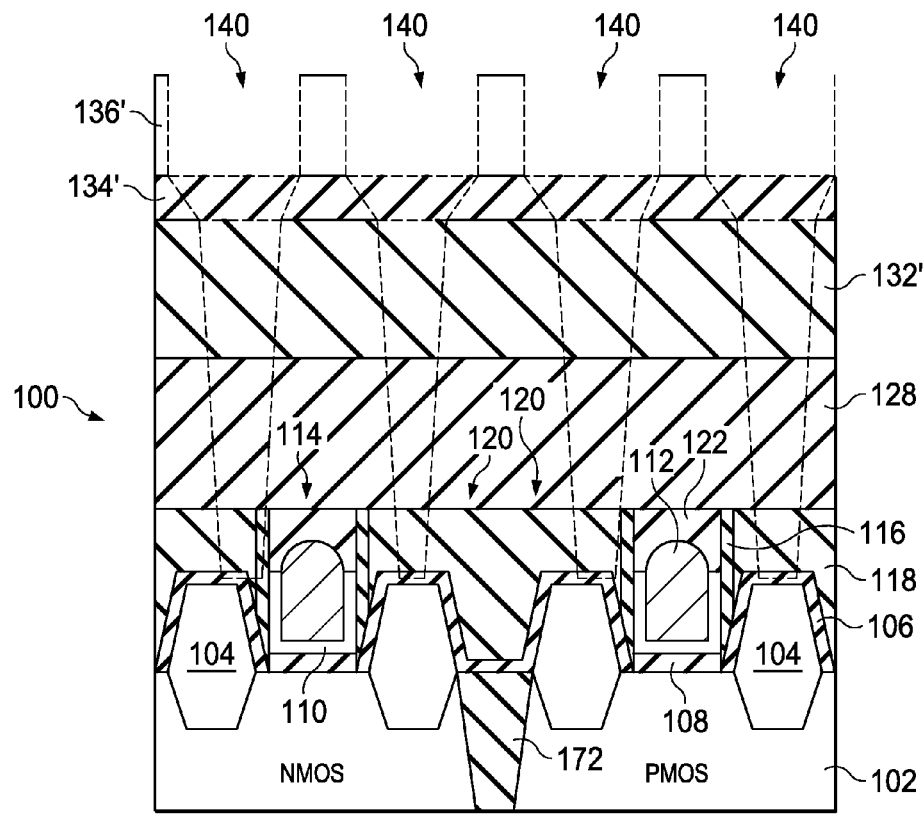
Figure 11:
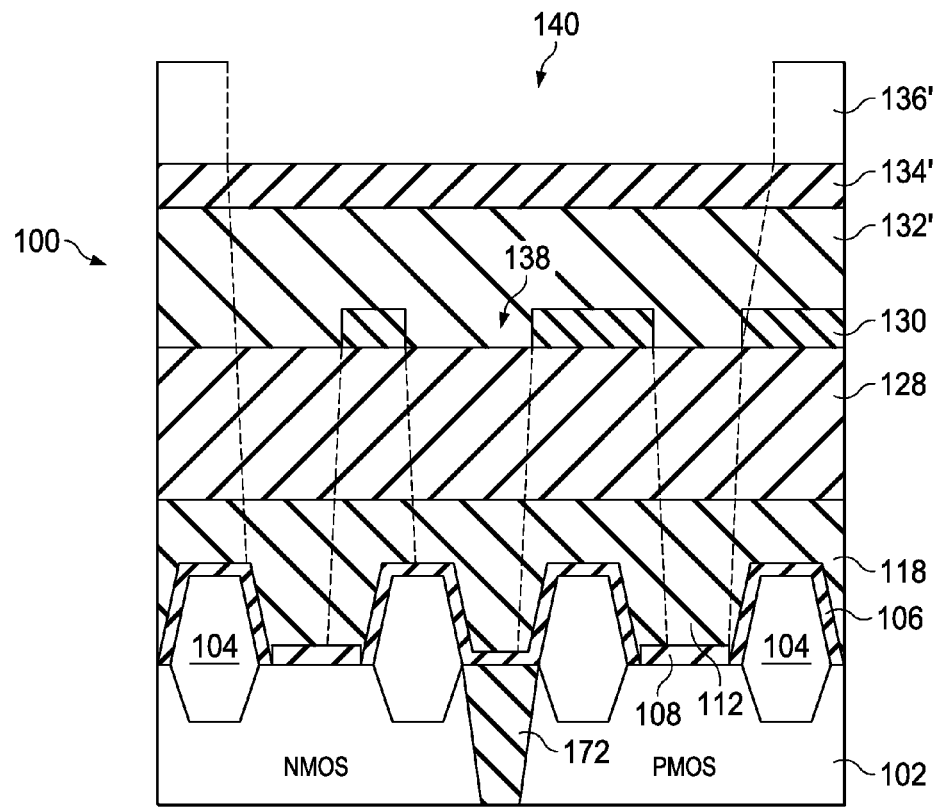

FIG. 10 is a cross-sectional view of the semiconductor device 100 showing substantially parallel source, drain, and well contact pattern 140 formation of a view of a substantially orthogonal direction of the gates 114 to the fins 104, and FIG. 11 is a cross-sectional view showing substantially orthogonal source, drain, and well contact pattern 140 formation of a view of a substantially parallel direction of the gates 114 to the fins 104.

A second bottom transfer layer 132' is formed over the patterned hard mask 130 and exposed portions of the insulating material 128, as shown in FIGS. 10 and 11. The second bottom transfer layer 132' comprises similar dimensions and materials as described for bottom transfer layer 132' in some embodiments, as examples. Alternatively, the second bottom transfer layer 132' may comprise other dimensions and materials. The second bottom transfer layer 132' comprises a sacrificial layer that is used to pattern patterns 142 (not shown in FIGS. 10 and 11; see FIG. 12) in underlying material layers of the semiconductor device 100.

A second middle transfer layer 134' is formed over the second bottom transfer layer 132', also shown in FIGS. 10 and 11. The second middle transfer layer 134' comprises similar dimensions and materials as described for the first middle transfer layer 134 in some embodiments, as examples. Alternatively, the second middle transfer layer 134' may comprise other dimensions and materials. The second middle transfer layer 134' also comprises a sacrificial layer that is used to pattern patterns 142 (not shown in FIGS. 10 and 11; see FIG. 12) in underlying material layers of the semiconductor device 100.

A second photoresist 136' is formed over the second middle transfer layer 134', as shown in FIGS. 10 and 11. The second photoresist 136' is patterned using a second lithography process and a second lithography mask, as described for the first lithography process for the first photoresist 136, forming a second pattern 140 in the photoresist 136', as shown in FIGS. 10 and 11. The second pattern 140 comprises a plurality of openings or patterns in the second photoresist 136'. At least some of the plurality of patterns of the second pattern 140 are different than the plurality of patterns of the first pattern 138 in some embodiments. For example, the plurality of patterns of the second pattern 140 are in a different location than the plurality of patterns of the first pattern 138 in some embodiments.

Figure 12:
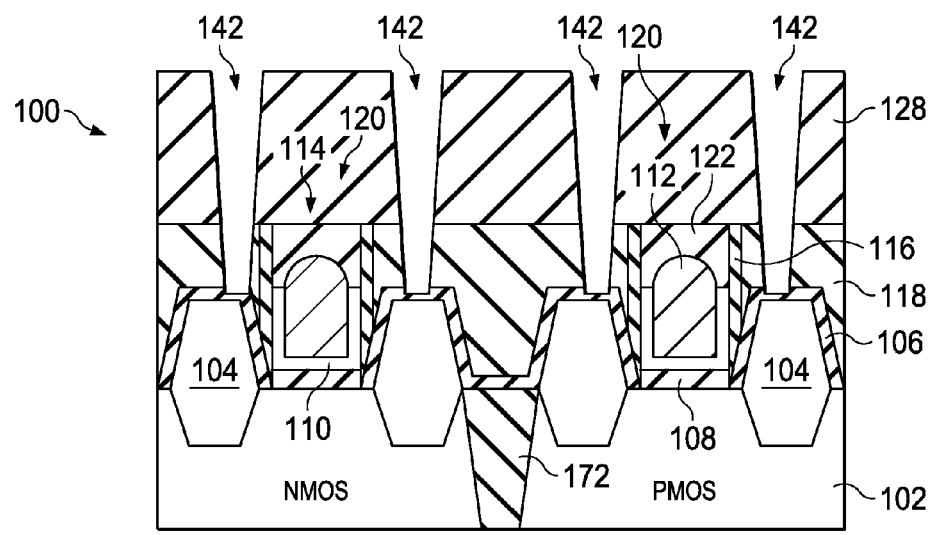

An etch process is performed on the semiconductor device 100 to transfer the second pattern 140 from the second photoresist 136' to the second middle transfer layer 134' and the second bottom transfer layer 132'. The second pattern 140 is then transferred from the second middle transfer layer 134' and the second bottom transfer layer 132' (and also the second photoresist 136' to the hard mask 130 using an etch process. The hard mask 130 that includes the first pattern 138 and second pattern 140, and the second middle transfer layer 134' and the second bottom transfer layer 132' (and also the second photoresist 136' in some embodiments) which includes the second pattern 140 are then used as an etch mask during an etch process for the underlying material layers, such as insulating material 128, insulating material 118, CESL 106, and liner 116, which transfers the first pattern 138 and the second pattern 140 to the underlying material layers and forms patterns 142 in the insulating material 128, insulating material 118, liner 116, and portions of the CESL 106, as shown in FIG. 12. The patterns 142 comprise patterns for contacts in some embodiments. The second photoresist 136', second middle transfer layer 134' and second bottom transfer layer 132' are then removed, also shown in FIG. 12. The second photoresist 136' may be removed during the patterning of the second middle transfer layer 134' and second bottom transfer layer 132' or during the etch process used to transfer the first pattern 138 and the second pattern 140 to the underlying material layers to form the patterns 142 for contacts, in some embodiments, for example. In some embodiments, the second photoresist 136', second middle transfer layer 134' and second bottom transfer layer 132' are removed before the etch process, and only the hard mask 130 is used as an etch mask when forming the patterns 142 for contacts. The hard mask 130 is then removed, also shown in FIG. 12.

The patterns 142 in the insulating material 128, insulating material 118, CESL 106, and liner 116 comprise openings over the fins 104 in FIG. 12. A portion of the CESL 106 is left remaining over the fins 104 in some embodiments; e.g., the CESL 106 may be partially etched. The patterns 142 also comprise openings over portions of the workpiece 102, such as over the insulating material 108 disposed over the workpiece 102, over well regions of the workpiece 102, and/or over STI regions 172 of the workpiece 102 (see patterns 140 in FIG. 11).

A third bottom transfer layer 132" is formed over the patterned insulating material 128, insulating material 118, CESL 106, and liner 116, as shown in FIG. 13. The third bottom transfer layer 132" fills the patterns 142 formed in the underlying material layers shown in FIG. 12. The third bottom transfer layer 132" comprises similar dimensions and materials as described for the first bottom transfer layer 132 in some embodiments, as examples. Alternatively, the third bottom transfer layer 132" may comprise other dimensions and materials. The third bottom transfer layer 132" comprises a sacrificial layer that is used to pattern patterns 142' (not shown in FIG. 13; see FIG. 14) in underlying material layers of the semiconductor device 100.

A third middle transfer layer 134" is formed over the third bottom transfer layer 132", also shown in FIG. 13. The third middle transfer layer 134" comprises similar dimensions and materials as described for the first middle transfer layer 134 in some embodiments, as examples. Alternatively, the third middle transfer layer 134" may comprise other dimensions and materials. The third middle transfer layer 134" also comprises a sacrificial layer that is used to pattern patterns 142' (not shown in FIG. 13; see FIG. 14) in underlying material layers of the semiconductor device 100.

A third photoresist 136" is formed over the third middle transfer layer 134", as shown in FIG. 13. The third photoresist 136" is patterned using a third lithography process and a third lithography mask, as described for the first lithography process for the first photoresist 136, forming a third pattern 144 in the third photoresist 136", as shown in FIG. 13. The third pattern 144 comprises a plurality of openings or patterns in the third photoresist 136". At least some of the plurality of patterns of the third pattern 144 are different than the plurality of patterns of the first pattern 138 (see FIG. 9) and/or the second pattern 140 (see FIGS. 10 and 11) in some embodiments. For example, the plurality of patterns of the third pattern 144 may be positioned in different locations than the plurality of patterns of the first pattern 138 and the second pattern 140 in some embodiments. In other embodiments, the plurality of patterns of the third pattern 144 may be positioned in the same locations as or may intersect with the plurality of patterns of the first pattern 138 and/or the second pattern 140, as another example.

An etch process is performed on the semiconductor device 100 to transfer the third pattern 144 from the third photoresist 136" to the third middle transfer layer 134" and the third bottom transfer layer 132". The third middle transfer layer 134" and the third bottom transfer layer 132", (and also the third photoresist 136" in some embodiments), are then used as an etch mask during an etch process for the underlying material layers, such as insulating material 128, insulating material 118, CESL 106, and liner 116, which transfers the third pattern 144 of the third photoresist 136" to the underlying material layers and forms patterns 142' in the insulating material 128, insulating material 118, CESL 106, and liner 116, as shown in FIG. 14. The third photoresist 136", third middle transfer layer 134" and third bottom transfer layer 132" are then removed, also shown in FIG. 14. The third photoresist 136" may be removed during the patterning of the third middle transfer layer 134" and third bottom transfer layer 132" or during the etch process used to transfer the third pattern 144 to the underlying material layers to form patterns 142' for contacts, in some embodiments, for example.

The patterns 142' in the insulating material 128, insulating material 118, CESL 106, and liner 116 comprise openings over portions of the gates 114 in FIG. 14. The patterns 142' may also comprise openings over portions of the fins 104 in some embodiments. The patterns 142' may not comprise openings over portions of the fins 104 in other embodiments. The patterns 142' may comprise portions that intersect with patterns 142 previously formed, further ensuring that the openings 142/142' are fully opened, advantageously.

A silicide 148 is then formed over exposed portions of the fins 104, also shown in FIG. 14. If a portion of the CESL 106 is left remaining over the fins 104, an etch process adapted to remove the material of the CESL 106 is performed on the semiconductor device 100 to remove the CESL 106. In some embodiments, the fins 104 are recessed, e.g., by about 2 nm to about 10 nm. In other embodiments, the fins 104 are not recessed. A silicide process, deposition process, or other process may be used to form a silicide such as $TiSi_2$, $CoSi_2$, $NiSi_2$, or other silicide materials comprising a thickness of about 5 Angstroms to about 30 Angstroms over a top surface of the fins 104. The silicide 148 may be formed by heating the workpiece 102 to a temperature of about 200 degrees C. to about 400 degrees C. for about 1 minute to about 5 minutes in the presence of a gas containing a Ti precursor or other precursor, as an example. Alternatively, other methods may be used to form the silicide 148. The silicide 148 improves the conductivity of the fins 104 in some embodiments, for example.

Referring next to FIG. 15, a conductive material 150 is then formed over the semiconductor device 100 over the patterned insulating material 128, insulating material 118, CESL 106, and liner 116, and over the exposed fins 104, gates 114, and other regions of the semiconductor device 100. The conductive material 150 comprises W or Cu and is deposited using PVD or ECP, as examples. In some embodiments, the conductive material 150 comprises W formed by PVD or Cu formed using an ECP process, as examples. Alternatively, the conductive material 150 may comprise other materials, and may be formed using other methods. The conductive material 150 fills the patterns in the insulating material 128, insulating material 118, CESL 106, and liner 116, and makes electrical and mechanical contact with the exposed fins 104 and gates 114. In some embodiments, the conductive material 150 overfills the patterns 142 and 142' in the insulating material 128 and extends over the top surface of the insulating material 128, as shown in FIG. 15. A CMP process and/or etch process is used to remove the excess conductive material 150 from over the top surface of the insulating material 128 and form contacts 150 comprised of the conductive material 150 formed within insulating material 128 and insulating material 118, as shown in FIG. 16.

During the etch processes used to form the patterns 142 and 142' (see FIG. 14), a portion of the gates 114 may be removed in some embodiments, which facilitates landing of the contacts 150 and improves (e.g., reduces) contact resistance Rc of the transistors 120. Furthermore, the curved dome shape of the second conductive material 112 of the rounded profile gates 114 provides increased surface area for the conductive material of the contacts 150 to make electrical and mechanical connection to the gates 114, further improving the contact resistance Rc.

The contacts 150 are disposed over the transistors 120 in accordance with some embodiments. The contacts 150 are coupled to the top surface of the second conductive material 112, to a top surface of the first conductive material 170, to a side surface of the second conductive material 112, to a side surface of the first conductive material 170, or a combination thereof, in some embodiments. Contacts 150 coupled to the gates 114 are also referred to herein, e.g., in some of the claims, as first contacts. Some of the contacts 150 comprise second contacts 150 that are coupled to one of the fins 104 in some embodiments.

Figure 17:
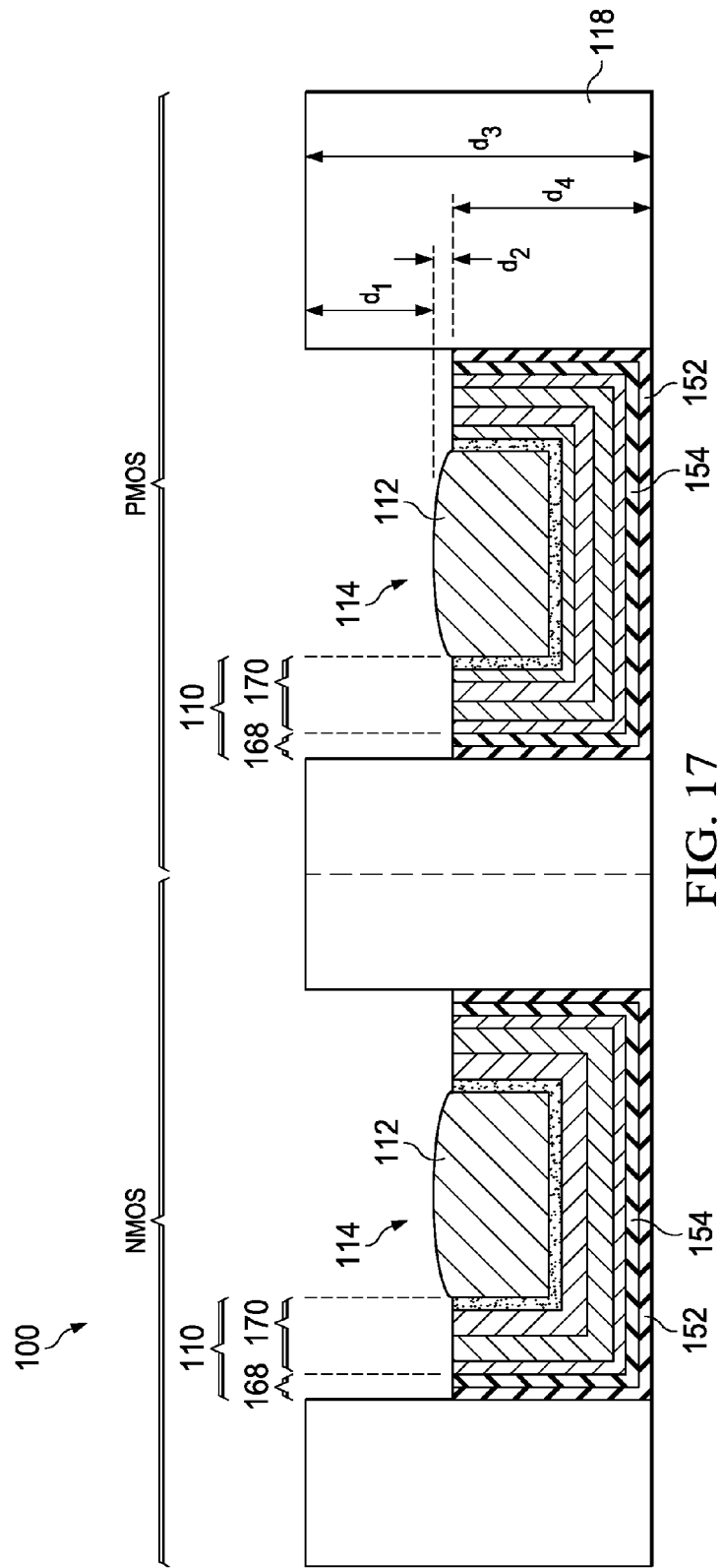
FIG. 17 is a cross-sectional view of a semiconductor device in accordance with some embodiments.

FIG. 17 is a cross-sectional view of a semiconductor device 100 in accordance with some embodiments that illustrates the dielectric material 168 and first conductive material 170 of the dielectric material and first conductive material layer 110 in more detail and shows some dimensions of portions of the semiconductor device 100. In some embodiments, the dielectric material 168 of the dielectric material and first conductive material layer 110 comprises a liner 152 and a high dielectric constant (k) material 154 disposed over the liner 152. The liner 152 comprises about 5 Angstroms to about 10 Angstroms of native oxide, PECVD oxide, a chemical oxide or other insulating materials formed by oxidation, an anneal process, or other methods, as examples. The high k material 154 comprises about 5 Angstroms to about 20 Angstroms of $HfO_2$, HfSiO, or HfSiON formed by ALD, as examples. Alternatively, the liner 152 and high k material 154 may comprise other materials, dimensions, and formation methods. The dielectric material 168 may alternatively comprise a single high k material 154 layer, or may comprise three or more layers, for example.

The first conductive material 170 of the dielectric material and first conductive material layer 110 comprises a work function metal in some embodiments that is adapted to set the work function of the transistors 120 (not shown in FIG. 17; see FIGS. 2 through 16 and FIG. 18) formed in the NMOS and PMOS regions. Thus, the first conductive material 170 may be different in the NMOS and PMOS regions. The first conductive material 170 comprises a plurality of material layers in accordance with some embodiments. The first conductive material 170 comprises one or more material layers comprising Ti, Ta, Al, an organic material, or combinations or multiple layers thereof having a thickness of about 10 Angstroms to about 50 Angstroms in some embodiments. Alternatively, the first conductive material 170 may comprise other materials and dimensions.

The top surface of the second conductive material 112 is recessed below a top surface of the insulating material 118 by an amount comprising dimension $d_1$, wherein dimension $d_1$ comprises about 20 nm to about 60 nm in some embodiments. In some embodiments, dimension $d_1$ comprises about 45 nm, for example. The dielectric material and first conductive material layer 110 is recessed below the top surface of the second conductive material 112 by an amount comprising dimension $d_2$, wherein dimension $d_2$ comprises about 1 nm to about 3 nm in some embodiments. The thickness of the insulating material 118 comprises dimension $d_3$, wherein dimension $d_3$ comprises about 60 nm to about 120 nm in some embodiments. Dimension $d_3$ comprises about 75 nm in some embodiments, for example. The height of the dielectric material 168 and the gates 114 which include the first conductive material 170 and second conductive material 112 comprises dimension $d_4$, wherein dimension $d_4$ comprises about 20 nm to about 50 nm in some embodiments. Dimension $d_4$ comprises about 30 nm in some embodiments, for example. Dimension $d_4$ substantially comprises a height of the fins of the gates 114 in some embodiments, for example. The thickness of the second conductive material 112 of transistors 120 in the NMOS region and PMOS region may vary in some embodiments due to the inclusion or lack of inclusion of various layers of the first conductive material 170. For example, in the embodiment shown in FIG. 17, the second conductive material 112 in the NMOS region may be about 10 nm or greater thicker than the second conductive material 112 in the PMOS region. Alternatively, dimensions $d_1$, $d_2$, $d_3$, $d_4$, and the relative thicknesses of the second conductive materials 112 in the NMOS and PMOS regions may comprise other values.

FIG. 18 is a perspective view of a semiconductor device 100 in accordance with some embodiments. Exemplary directions of the extended fins 104 and the gates 114 are shown. The semiconductor device 100 is shown after the top surface of the second conductive material 112 of the gates 114 has been recessed, in accordance with some embodiments. An insulating material 172 comprising $SiO_2$ or other insulating materials is disposed around a lower portion of the fins 104 over the workpiece 102 and is disposed between the PMOS and NMOS regions. The insulating material 172 comprises an STI region in some embodiments, for example. The first conductive material 170 in the PMOS region may include an additional material layer in some embodiments, compared to the first conductive material 170 in the NMOS region. The first conductive material 170 in the PMOS region has a thickness comprising dimension $d_5$, wherein dimension $d_5$ comprises about 15.5 nm in some embodiments. The first conductive material 170 in the NMOS region has a thickness comprising dimension $d_6$, wherein dimension $d_6$ comprises about 11.5 nm in some embodiments. The gates 114 comprise a width comprising dimension $d_7$, wherein dimension $d_7$ comprises about 30 nm in some embodiments. Dimension $d_7$ comprises a critical dimension (CD) of the semiconductor device 100 in some embodiments, for example. Alternatively, dimensions $d_5$, $d_6$, and $d_7$ may comprise other values. Each transistor 120 may comprise a plurality of the gates 114 arranged in parallel, in some embodiments. Alternatively, each gate 114 may be associated with a single fin 104 in the PMOS and/or NMOS region.

In some embodiments, the transistors 120 described herein comprise FinFETs. The transistors 120 may comprise PMOS devices or NMOS devices, or a combination thereof, in accordance with some embodiments. The transistors 120 comprise complementary metal oxide semiconductor (CMOS) devices in some embodiments.

Figure 19:
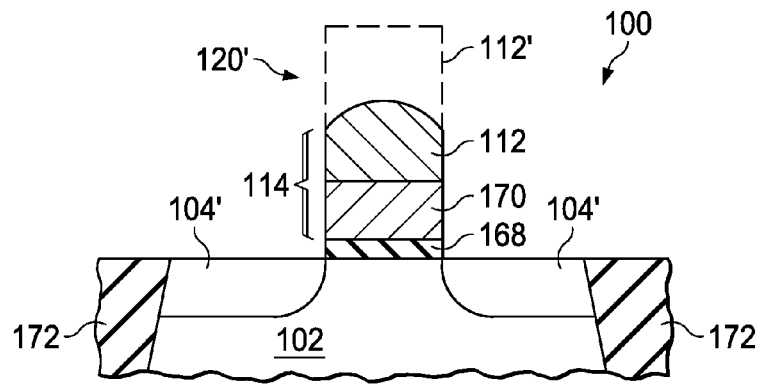
FIG. 19 is a cross-sectional view of a transistor in accordance with some embodiments.

FIG. 19 is a cross-sectional view of a semiconductor device 100 that includes a planar transistor 120' in accordance with some embodiments. A source region 104', drain region 104', and STI regions 172 are formed in a workpiece 102. A dielectric material 168 comprising a gate dielectric is disposed over the workpiece 102, and a gate 114 is disposed over the dielectric material 168. The gate 114 comprises a first conductive material 170 and a second conductive material 112. The top surface of the gate 114 is recessed using an etch process, as described for the embodiments shown in FIGS. 1 through 18. The top surface of the second conductive material 112 of the gate 114 has a rounded profile. The top surface of the second conductive material 112 as-deposited, prior to the etch process, is shown in phantom (e.g., in dashed lines) at 112'. FIG. 19 illustrates that some embodiments of the present disclosure are implementable in planar transistors 120' as well as FinFET transistors 120 (see FIG. 18).

Figure 20:
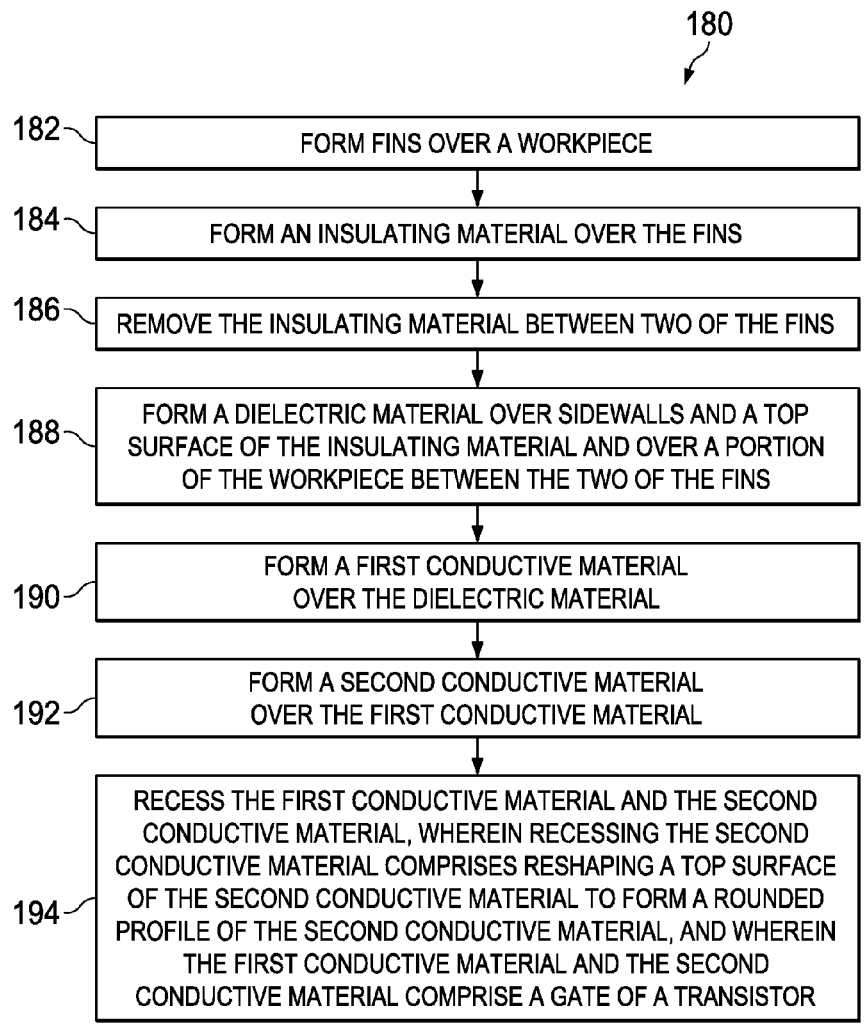
FIG. 20 is a flow chart of a method of manufacturing a semiconductor device in accordance with some embodiments.

FIG. 20 is a flow chart 180 of a method of manufacturing a semiconductor device 100 (see also FIG. 1) in accordance with some embodiments. In step 182, fins 104 are formed over a workpiece 102, and in step 184, an insulating material 118 is formed over the fins 104. In step 186, the insulating material 118 is removed between two of the fins 104. In step 188, a dielectric material 168 (see FIG. 17) is formed over sidewalls and a top surface of the insulating material 118 and over a portion of the workpiece 102 between the two of the fins 104. In step 190, a first conductive material 170 (see FIG. 17) is formed over the dielectric material 168, and in step 192, a second conductive 112 material is formed over the first conductive material 170 (see FIG. 17, FIG. 1, and FIG. 2). In step 194, the first conductive material 170 and the second conductive material 112 are recessed (see FIGS. 3 and 4). Recessing the second conductive material 112 comprises reshaping a top surface of the second conductive material 112 to form a rounded profile of the second conductive material 112. The first conductive material 170 and the second conductive material 112 comprise a gate 114 of a transistor 120.

Some embodiments of the present disclosure include methods of forming semiconductor devices 100, and also include semiconductor devices 100 and transistors 120 that include the gates 114 with a rounded profile described herein. Embodiments of the present disclosure comprise methods and structures that provide Rc contact enhancement, e.g., of contacts 150 that are coupled to the gates 114.

Advantages of some embodiments of the disclosure include providing novel transistors that have gates with a rounded profile. The rounded profile gates provide a larger surface area and a larger and wider contact area for contacts to make electrical and mechanical connection to the gates. The novel etch processes used to reshape a gate top surface enhance RC delay and RC electrical performance and avoid seam hole issues. The rounded profile gates also avoid RC contact resistance tailing or shorting. The top surface of the gate material is higher than adjacent work function materials in some embodiments. Direct CMP processes may be used to form the second conductive material and first conductive material in some embodiments. The novel manufacturing process flows for forming the gates avoid a need for a breakthrough step (e.g., for the second conductive material 112), which could potentially result in reduced fall-on or re-sputtering problems. The manufacturing process flows avoid a need to perform an ash process to remove a polymer material, in the gate formation and other processing steps. The methods described here provide a low cost solution for forming gates that can be performed in-situ. The novel transistors and manufacturing methods result in improved wafer acceptance tests (WATs) and improved yields.

The novel gates with rounded profiles are particularly useful in manufacturing process flows for transistors of semiconductor devices that include a replace gate (RPG) step, wherein a gate material replacement step to fill a gap fill with a material such as W is performed, for example. The rounded profile gates may be implemented in MUGFETs such as FinFETs or in planar transistors. Furthermore, the novel transistor and semiconductor device structures and designs are easily implementable in manufacturing process flows.

In accordance with some embodiments of the present disclosure, a method of manufacturing a semiconductor device includes providing a workpiece including a gate dielectric and a gate disposed over the gate dielectric, and reshaping a top surface of the gate to form a gate with a rounded profile.

In accordance with other embodiments, a method of manufacturing a semiconductor device includes forming a plurality of fins over a workpiece, forming an insulating material over the plurality of fins, and removing the insulating material between two of the plurality of fins. A dielectric material is formed over sidewalls and a top surface of the insulating material and over a portion of the workpiece between the two of the plurality of fins. The method includes forming a first conductive material over the dielectric material, forming a second conductive material over the first conductive material, and recessing the first conductive material and the second conductive material. Recessing the second conductive material comprises reshaping a top surface of the second conductive material to form a rounded profile of the second conductive material. The first conductive material and the second conductive material comprise a gate of a transistor.

In accordance with other embodiments, a semiconductor device includes a transistor that has two fins disposed over a workpiece, and an insulating material disposed over the fins yet not disposed between the two fins. A dielectric material is disposed over sidewalls of the insulating material and over a portion of the workpiece between the two fins. A gate is disposed over the dielectric material. The gate comprises a first conductive material and a second conductive material disposed over the first conductive material. The second conductive material is recessed below a top surface of the insulating material and comprises a top surface with a rounded profile.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    providing a workpiece including a gate dielectric and a gate disposed over the gate dielectric;
    reshaping a top surface of the gate to form a gate with a rounded profile; and
    etching a via and forming a contact therein, wherein the contact is disposed on at least a portion of the rounded profile of the gate.

2. The method according to claim 1, wherein the gate comprises a first conductive material disposed over the gate dielectric and a second conductive material disposed over the first conductive material, and wherein reshaping the top surface of the gate comprises recessing the second conductive material.

3. The method according to claim 2, wherein recessing the second conductive material comprises an etch process that comprises an etch chemistry selected from the group consisting essentially of $Cl_2$, $BCl_3$, and combinations thereof.

4. The method according to claim 2, further comprising recessing the first conductive material.

5. The method according to claim 4, wherein recessing the first conductive material comprises an etch process that comprises an etch chemistry selected from the group consisting essentially of $SF_6$, $O_2$, $NF_3$, $CF_4$, and combinations thereof.

6. The method according to claim 2, wherein recessing the second conductive material comprises an etch process comprising a flow rate of about 10 standard cubic centimeters per minute (s.c.c.m.) to about 200 s.c.c.m.

7. The method according to claim 2, wherein recessing the second conductive material comprises an etch process comprising a pressure of about 1 mT to about 30 mT.

8. The method according to claim 2, wherein recessing the second conductive material comprises an etch process comprising a chuck temperature of about 30 degrees C. to about 60 degrees C. or chamber wall temperature of about 50 degrees C. to about 90 degrees C.

9. A method of manufacturing a semiconductor device, the method comprising:
forming a plurality of fins over a workpiece;
forming an insulating material over the plurality of fins;
removing the insulating material between two of the plurality of fins to form a patterned insulating material;
forming a dielectric material over sidewalls and a top surface of the insulating material and over a portion of the workpiece between the two of the plurality of fins;
forming a first conductive material over the dielectric material;
forming a second conductive material over the first conductive material; and
recessing the first conductive material and the second conductive material, wherein recessing the second conductive material comprises reshaping a top surface of the second conductive material to form a rounded profile of the second conductive material, and wherein the first conductive material and the second conductive material comprise a gate of a transistor.

10. The method according to claim 9, wherein forming the second conductive material comprises overfilling a space in the insulating material between the two of the plurality of fins; and wherein the method further comprises chemically-mechanically polishing or etching the insulating material after forming the second conductive material, leaving the first conductive material and the second conductive material within the patterned insulating material.

11. The method according to claim 9, wherein the insulating material comprises a first insulating material, and wherein the method further comprises forming a second insulating material over the second conductive material after recessing the first conductive material and the second conductive material.

12. The method according to claim 11, further comprising forming a third insulating material over the first insulating material and the second insulating material, and forming a contact in the third insulating material and the second insulating material, wherein the contact is coupled to the second conductive material of the gate.

13. The method according to claim 9, wherein forming the first conductive material comprises forming a work function metal comprising a plurality of material layers.

14. The method according to claim 9, wherein recessing the first conductive material and the second conductive material comprises an etch process that comprises an etch chemistry selected from the group consisting essentially of $SF_6$, $O_2$, $NF_3$, $CF_4$, and combinations thereof.

15. The method according to claim 9, wherein recessing the second conductive material comprises an etch process comprising a flow rate of about 10 standard cubic centimeters per minute (s.c.c.m.) to about 200 s.c.c.m.

16. The method according to claim 9, wherein recessing the second conductive material comprises an etch process comprising a pressure of about 1 mT to about 30 mT.

17. A method of manufacturing a semiconductor device, the method comprising:
forming a fin on a semiconductor substrate;
forming a gate structure on the fin, the gate structure including a dielectric layer and a metal layer, the metal layer having a substantially planar top surface; and
etching the metal layer to form a top surface having a convex shape.

18. The method according to claim 17, wherein the metal layer comprises a first metal sub-layer of a first material and a second metal sub-layer of a second material different from the first material, the first metal sub-layer being interjacent the dielectric layer and the second metal sub-layer.

19. The method according to claim 17, wherein etching the metal layer comprises an etch process using an etch chemistry selected from the group consisting of $SF_6$, $O_2$, $NF_3$, $CF_4$, and combinations thereof.

20. The method according to claim 18, wherein the second metal sub-layer comprises Cu.

* * * * *